United States Patent
Yedur et al.

(10) Patent No.: US 6,813,574 B1
(45) Date of Patent: Nov. 2, 2004

(54) TOPOGRAPHICALLY ALIGNED LAYERS AND METHOD FOR ADJUSTING THE RELATIVE ALIGNMENT OF LAYERS AND APPARATUS THEREFOR

(75) Inventors: Sanjay K. Yedur, San Ramon, CA (US); Bhanwar Singh, Morgan Hill, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 316 days.

(21) Appl. No.: 09/992,599

(22) Filed: Nov. 6, 2001

Related U.S. Application Data

(60) Provisional application No. 60/246,146, filed on Nov. 6, 2000.

(51) Int. Cl.[7] .......................... G01N 21/86; G21K 5/10; G01B 7/00
(52) U.S. Cl. ...................... 702/95; 250/548; 250/559.4; 250/491.1; 356/401; 430/30
(58) Field of Search ........................... 702/94, 95, 153, 702/152; 250/491.1, 548, 559.3, 559.4; 356/399, 400, 401

(56) References Cited

U.S. PATENT DOCUMENTS

| | | | | |
|---|---|---|---|---|
| 3,657,545 A | * | 4/1972 | Horne | 250/548 |
| 5,317,141 A | * | 5/1994 | Thomas | 250/491.1 |
| 5,617,340 A | * | 4/1997 | Cresswell et al. | 702/85 |
| 5,798,947 A | * | 8/1998 | Ye et al. | 702/95 |
| 5,929,997 A | * | 7/1999 | Lin | 356/401 |
| 6,057,068 A | * | 5/2000 | Raeder et al. | 430/30 |
| 6,225,639 B1 | * | 5/2001 | Adams et al. | 250/559.4 |

* cited by examiner

*Primary Examiner*—Bryan Bui
*Assistant Examiner*—John Le
(74) *Attorney, Agent, or Firm*—Renner, Otto, Boisselle & Sklar, LLP

(57) ABSTRACT

Patterned layers in an integrated circuit (IC) or other device are aligned in conjunction with the detection of the topology of the layers. The topology can be used to determine the location of a metrology mark and/or to compensate for a horizontal shift in the apparent location of the metrology mark. Precise detection of topography can be achieved without physical contact with the IC or other device with an atomic force microscope.

20 Claims, 3 Drawing Sheets

TOPOGRAPHICALLY ALIGNED LAYERS AND METHOD FOR ADJUSTING THE RELATIVE ALIGNMENT OF LAYERS AND APPARATUS THEREFOR

Priority is claimed under 35 U.S.C. 119(e) from U.S. provisional patent application Ser. No. 60/246,146, filed Nov. 6, 2000.

TECHNICAL FIELD

This invention generally relates to an alignment technique, and, more particularly to a method of aligning patterned layers in an integrated circuit or other device and a device formed thereby, to a method of adjusting the alignment of patterned layers in an integrated circuit or other device, and to an apparatus therefor.

BACKGROUND

The fabrication of integrated circuits and other electronic circuits on wafers is a precise process which results in a precisely constructed circuit. However, as with any manufacturing process, there is some variation in the fabrication process which may be manifested in the manufactured circuit. A functional circuit results when the variation is within acceptable tolerances and a defective circuit results when the variation is beyond acceptable tolerances.

One such tolerance is related to the relative alignment between layers in the circuit. The circuit components of one layer must be aligned within acceptable tolerances to the circuit components in one or more associated layers in order to interact as required. Thus, metrology marks such as an X pattern or a □ (square) pattern have been employed to assure the alignment of associated layers is within acceptable tolerances. Unfortunately, tolerances become smaller as circuit line widths become smaller.

The decreased line widths of modern circuits have resulted in tolerances so small that conventional metrology alignment techniques no longer insure proper alignment between layers. This can be attributed to several problems. For example, the optical alignment of metrology marks may fail to properly align layers due to distortion of metrology marks from chemical mechanical polishing, optical shifting from light refraction, and poor observability from shallow metrology marks, low transmissivity or high transmissivity (especially with planarized layers). Similarly, topology metrology marks may fail to be properly align layers due to distortion of metrology marks from chemical mechanical polishing, physical shifting of the topology of topological metrology marks by uneven removal and/or distortion of metrology marks from chemical mechanical polishing.

Accordingly, there is a strong need in the art for an alignment technique that overcomes the aforementioned problems.

SUMMARY OF THE INVENTION

An aspect of the present invention is to provide an alignment method including detecting a topology of at least one layer, determining an apparent location of a metrology mark, adjusting the apparent location of the metrology mark to determine an adjusted location of the metrology mark, and aligning another layer according to the adjusted location of the metrology mark.

Another aspect of the present invention is to provide a fabrication method for a layered device including providing a substrate including a metrology feature, determining the topology of one or more layers formed on the substrate, forming a patterned layer on the one or more layers formed on the substrate, determining whether the patterned layer is within one or more tolerances, the one or more tolerances being determined in accordance with the topology of the one or more layers, and selecting the next processing step in accordance with whether the patterned layer is within the one or more tolerances.

Another aspect of the present invention is to provide an apparatus for aligning including a detector for detecting a topology of at least one layer to determine an apparent location of a metrology mark, the apparent location of the metrology mark being offset from the actual position of the metrology mark by a distortion amount, and a mask which is aligned according to the apparent location and adjustment information, wherein the adjustment information is corresponds to the distortion amount.

Another aspect of the present invention is to provide a layered device including a plurality of patterned layers, at least one of the plurality of patterned layers being planarized and having at least one topological metrology feature indicative of a position of a pattern of another of the plurality of patterned layers, and an aligned layer aligned with the pattern of the another of the plurality of patterned layers which includes an alignment adjustment to compensate for the at least one of the plurality of patterned layers being planarized.

Another aspect of the present invention is to provide a layered device including a plurality of patterned layers, at least one of the plurality of patterned layers being planarized and having a metrology feature indicative of a position of a pattern of another of the plurality of patterned layers, and a masking layer aligned with the pattern of the another of the plurality of patterned layers which includes an alignment adjustment to compensate for the at least one of the plurality of patterned layers being planarized.

To the accomplishment of the forgoing and related ends, the invention, then, comprises the features herein after fully described and particulary pointed out in the claims. The following description and the annexed drawings set forth in detail certain illustrative embodiments of the invention. These embodiments are indicative, however, of but a few of the various ways in which the principles of the invention may be employed. Other aspects, advantages and novel features will become apparent from the following detailed description of the invention when considered in conjunction with the drawings.

DETAILED DESCRIPTION OF THE PREFERRED EMBODIMENTS

Figure 1:
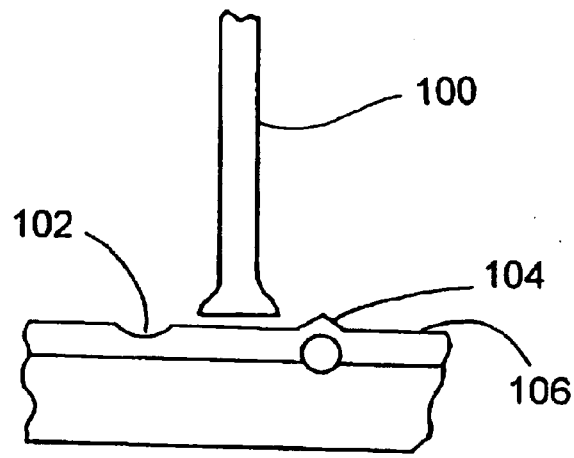
FIG. 1 shows an atomic force microscope probe detecting topological features on a horizontal surface.

The present invention will now be described with reference to the drawings wherein like reference numerals are used to refer to like elements throughout.

The present invention relies upon an atomic force microscope (AFM), or any other nondestructive surface topology detection means having high resolution, to precisely align the patterned layers of an integrated circuit or other device in two different ways. First, an AFM is used to precisely detect where metrology marks are located and this information is used to directly align circuit layers. Second, an AFM is used to profile circuit layers during the fabrication process and the profile is used to adjust the alignment of layers during fabrication. An AFM is used to precisely detect the topology of circuit layers in each of the two ways.

Figure 2:
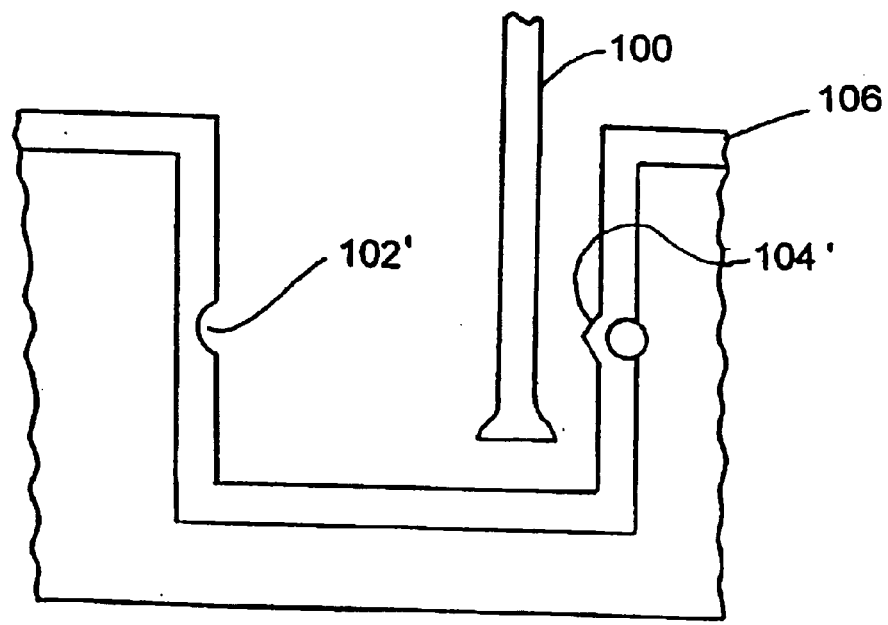
FIG. 2 shows an atomic force microscope probe detecting topological features on a vertical surface.

FIGS. 1 and 2 show the detection of topological features using one dimensional atomic force microscopy although the methods detailed herein may be used with any kind of nondestructive topology testing. FIG. 1 shows an AFM probe 100 detecting topological features on a horizontal surface and FIG. 2 shows an AFM probe 100 detecting topological features on a vertical surface. The AFM probe 100 can detect extremely minute (<2 Ångstrom) topological features and can detect features that are horizontal and/or vertical. The AFM probe 100 determines the topography of a surface by reacting to fields (e.g., Van Der Waal forces) generated by the surface and does not come into physical contact with the surface. Thus, the surface will not be accidentally damaged during testing.

FIG. 1 shows the AFM probe 100 detecting a horizontal thin portion 102 and then a horizontal raised portion 104 of a surface layer 106 as the AFM probe 100 moves from the left to the right. Similarly, FIG. 2 shows the AFM probe 100 detecting a vertical thin portion 102' and a vertical raised portion 104' as the AFM probe 100 moves from the left to the right while moving down and then up the trench. The vertically thin portion 102' and the vertically raised portion 104' will be detected in the same manner that the horizontal thin portion 102 and the horizontal raised portion are detected. The thin portions 102, 102' and the raised portions 104, 104' may be any kind of structure including a defect or metrology feature.

An AFM can be used to directly align layers by determining the topology of a surface including a topological metrology feature. One novel use of AFM is the detection of a topological metrology feature that is covered by a planarized metal layer that is otherwise unobservable. The poor observability of the planarized metal layer makes optical alignment with the layer opaque difficult because metal is opaque. Additionally, the planarizing of the metal layer also makes topological alignment difficult because of the reduced size of the metrology feature, e.g., a trench, and because of the distortion cause by planarization.

Figure 3:
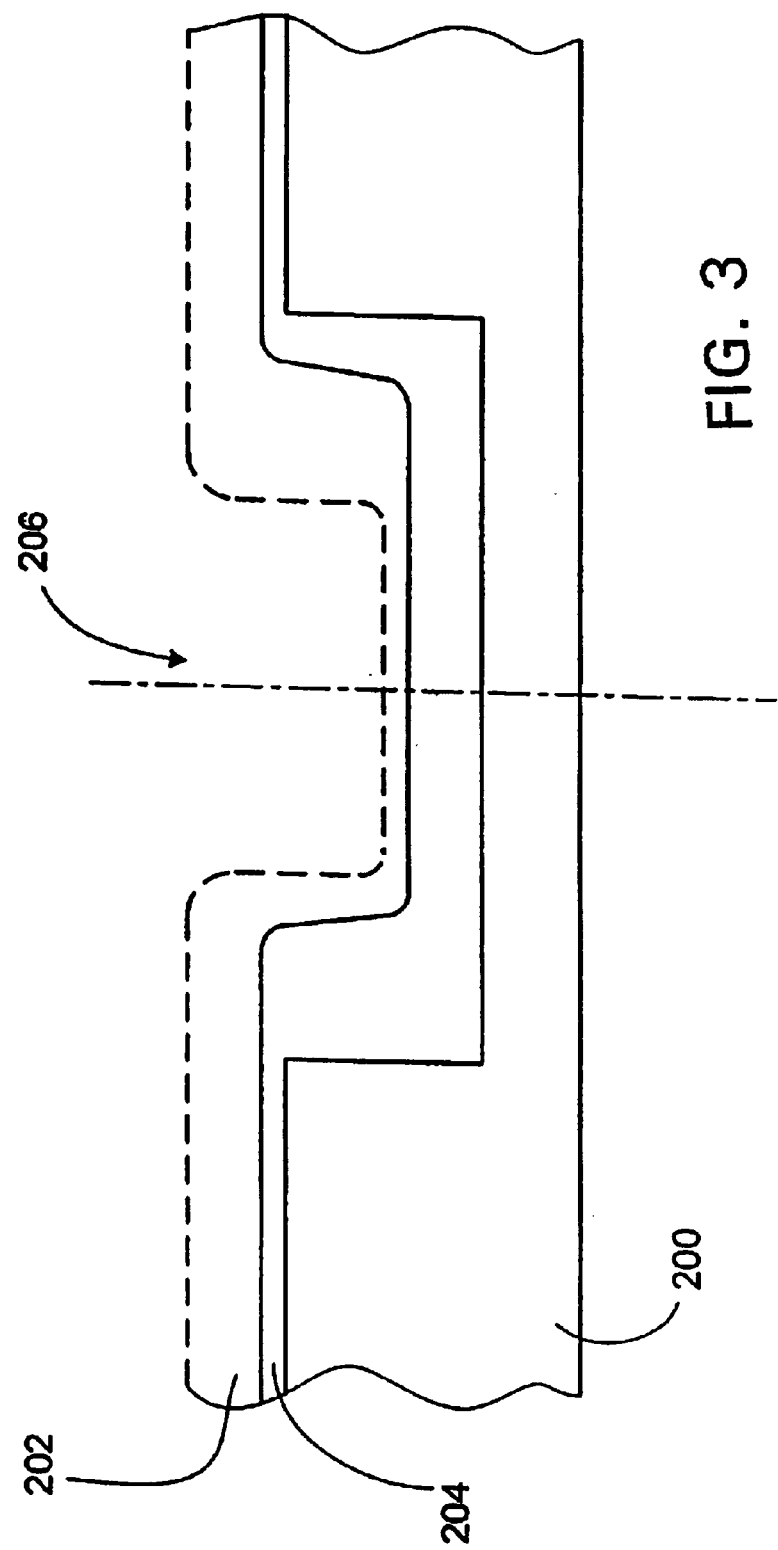
FIG. 3 is a cross section of a metrology mark of an embodiment of the present invention.

FIG. 3 is a cross section of a dielectric sheet 200 that has been coated with a metal layer. The metal layer is then planarized removing an upper portion 202 of the metal layer and leaving a planarized metal layer 204. A trench in the dielectric sheet 200 is also coated by the metal layer and will impact the topology of the metal layer by the presence of a dip 206. For example, the metal layer could be a 250 nm tungsten layer that coats a 500 nm deep and 2000 nm wide trench. The metal layer could then be planarized by a chemical mechanical polish (CMP) that is mostly or completely removes the metal not in the trench. The dip 206 will appear in the metal layer provided the width of the trench is more than twice the thickness of the metal layer. However, fusing of the opposing sides of the metal layer will prevent the formation of a dip 206' when the width of the trench is not more than twice the thickness of the metal layer. The dip 206 is initially centered in the middle of the trench but is shifted from the middle by the planarizing. The shifting occurs because more metal is removed from one side of the trench than the other. Thus, the apparent center of the trench is horizontally shifted from the actual center. Fortunately, horizon shifting from planarization is relatively constant for a given fabrication process and can be included in the metrology features.

Alignment problems similar to those which occur in planarized metal layers also occur with layers of high transmissivity. Metal layers transmit so C) little light that optical observation is difficult. Highly transmissive layers transmit so much of the light that optical observation of the differences is difficult. Fortunately, the present invention works exactly the same and equally well with both planarized highly transmissive layers planarized metal layers.

An AFM can be used to profile circuit layers during the fabrication process. The profile can be used to adjust (e.g., shift) the alignment of those and subsequent layers during fabrication. The adjustment helps to eliminate or minimize of alignment errors that occur and/or accumulate during the manufacturing process. This is especially effective where the alignment errors occur over a range (e.g., random or variable errors) and result in horizontal shifting of the alignment mark from an optimal position.

The profile can also be used to otherwise modify the pattern of a layer about to be deposited or patterned according to a predetermined relationship between the detected topology and the actual alignment of the patterned layers. For example, a CMP polished layer which is not sufficiently smooth could be further polished or a defective layer could be removed and redeposited and/or repatterned.

The profile can also be used to make other decisions about the fabrication process so far. For example, a device which is misaligned or otherwise defective can be reprocessed or discarded. This improves the yield and reduces costs.

The horizontal shift of alignment errors can be caused by numerous factors. These factors often result in a predictable horizontal shift which may be determined for a particular fabrication process. However, it is often the case that the relationships which result in the horizontal shift are so complex or poorly understood that the ability to generate relationships or formulas is impractical if not impossible. Thus, it is often easiest to determine the horizontal shift empirically.

One cause of horizontal shifting is optical refraction. Refraction occurs at an angled boundary where the index of refraction on one side of the boundary differs from the index of refraction on the other side of the boundary. Such a boundary may be created by two patterned layers formed on each other with the lower of the two patterned layers including an optical metrology mark. For example, the upper layer could be a photoresist layer which is to be patterned by a mask aligned to the optical metrology mark. But, if the photoresist is angled, the optical metrology mark will have an apparent position that is horizontally shifted from its actual position. The amount of the shift can be determined using the layer thicknesses, topologies and Snell's law ($n1 \cdot \sin \theta_1 = n2 \cdot \sin \theta_2$, where n is the index of refraction of a material and $\theta$ is the angle from the surface normal). The refraction alters the apparent position of an optical metrology mark and introduces a horizontal shift of $\sin (\delta) \cdot$ layer thickness in the alignment of the two identically patterned layers. The $\delta$ corresponds to the actual slope of the photoresist layer. If $\delta$ randomly varied between 2°–6°with an average $\delta$ of 4°, the best a circuit designer can do is to design according to the average horizontal shift. Thus, the misalignment is $\sin (\delta-4°) \cdot$ layer thickness. For this example, $\delta$ has a ±2°deviation which corresponds to a possible variation of nearly 3.5% of the thickness of one layer. If there were 10 layer thicknesses between the metrology mark and the photoresist, a nearly 35% of the thickness of one layer variation would be possible. However, the misalignment can be reduced by the present invention to sin (δ-measured slope angle)·layer thickness or substantially zero by adjusting the apparent location according to the measured topology of the photoresist layer.

Similarly, horizontal shifting can also occur with topological metrology features. For example, a patterned layer with a topological metrology mark is covered with a metal layer (e.g., tungsten, copper, or the like) and is patterned with a photoresist layer. When the photoresist layer is applied to the metal layer, the photoresist effectively flows onto the metal. The photoresist has a flow pattern and may have uneven topology, especially where the underlying topology of the metal layer is also uneven. Uneven widths, thicknesses and/or slopes, for example, can result in the metal layer having horizontal shift as compared to the metrology mark underneath.

Thus, similar to the adjustment for optical shifting discussed above, an adjustment can also be made for topologically aligned metrology marks. These and other problems can be corrected or minimized by using an AFM or another appropriate measuring instrument to detect the topography of the layers as they are formed and adjust the relative alignment of the layers. These and other features of the present invention are more fully discussed with respect to FIG. 4.

Figure 4:
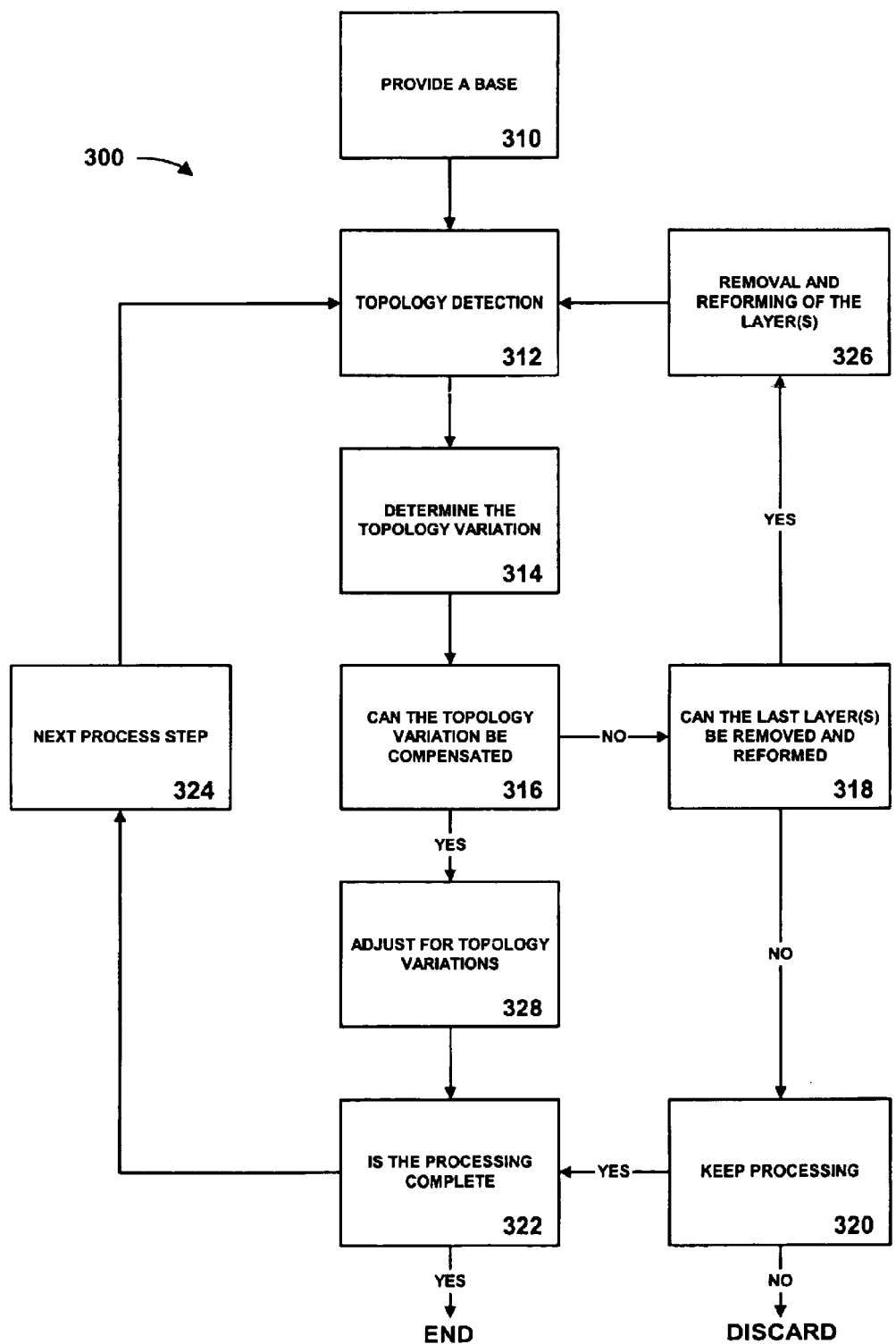
FIG. 4 is a block diagram flow chart of the steps of an alignment method of an embodiment of the present invention.

FIG. 4 shows a functional flow chart 300 which uses topography detection by, e.g., one dimensional atomic force microscopy, to help improve and ensure proper alignment of a plurality of patterned layers by correcting for horizontal shift. The method illustrated in FIG. 4 also detects other imperfections and foreign matter on, in or under the patterned layers. The method enables compensation for these other imperfections and foreign matter to produce a functional integrated circuit or device or, if the integrated circuit or device cannot be salvaged, it is discarded to save the cost of additional processing steps.

More specifically, the first step of FIG. 4 is to provide a base 310 on which a plurality of layers may be deposited. Bases can include uncoated substrates, substrates coated with one or more layers of dielectrics, insulators, semiconductors, metals or other materials, the surfaces of fabricated devices, or any other surface on which one or more layers are to be formed. In some cases, the base may need to be aligned with one or more layers of the plurality of layers. This can be achieved with one or more metrology marks or by any other aligning method and/or device.

The next method step performed is topography detection 312. The initial topography corresponds to the topography of the base provided in step 310. The topography can be determined by an AFM or other appropriate device. This step 312 is later repeated for each layer thereby generating a complete layer by layer profile which can be stored in a memory device (e.g., the hard drive of a computer).

In the next step of determining the topography variation 314, the profile data is used to perform calculations to determine if the layers include defects, to determine if the layers are aligned, and to determine if other similar topography variations are present. The topography of each layer provides a good indication of the relationship between the layers if it is assumed that layers and features stack vertically without any horizontal shifting. However, some horizontal shifting may occur. Thus, it is preferable that step 314 consider and/or determine if and how much horizontal shifting has occurred to further improve the alignment between layers.

Step 314 determines its calculation from precise measurement of fabricated devices. Since these fabricated devices need not work after testing, more precise destructive testing methods, such as a scanning electron microscope (SEM), may be employed to characterize the fully fabricated device. This enables the calculations of step 314 by providing a correlation between the actual alignment, horizontal shifting and the like for certain the process steps, process conditions and other factors. Thus, it is possible to empirically relate topography and actual alignment. Sometimes the empirical relationship will reduce to a simple formula such as Snell's law while at other times the relationship will not reduce to a formula. In either circumstance, iterative testing and extrapolation can be used to generate the relationship.

The step of deciding whether the topological variation can be compensated 316 is performed after the step of determining the topological variation 314. Some variations may be compensated while other cannot be compensated. For example, compensation is effective where a mask needs to be shifted to compensate for a horizontal shift. Alternatively, stripping and reforming a layer, e.g., an improperly coated photoresist layer, to eliminate a contaminate or similar imperfection could be performed. Other situations exist where compensation is or is not effective and those situations are intended to be encompassed when practicing the present invention. The decision of whether a topology variation can be compensated is often a cost effectiveness decision. Repositioning a mask is inexpensive while removing and reforming a layer is more expensive.

The step of determining whether the last layer(s) can be removed and reformed 318 is performed where a variation cannot be compensated due to process limitations, cost or other factors. Where the last layer(s) cannot be removed and reformed, the step of deciding whether to keep processing 320 is performed. If processing is to be discontinued, the integrated circuit or other device is discarded saving the cost of the subsequent processing. If the integrated circuit or other device is kept, the step of determining whether the processing is complete 322 is performed. The processing ends if the device is complete and processing continues with the next processing step 324 if the device is incomplete. However, where step 318 determines that removal and reforming of the last layer(s) should be done, the step of the removal and reforming of the layer(s) 326 is performed saving the cost of discarding the IC or other device and the method continues at the step of topology detection 312.

Where a variation can be compensated, the step of adjustment for topological variations 328 is performed. This step may cause a repositioning of a mask to adjust or compensate for horizontal shift. Next, a determination of whether or not the integrated circuit or other device is complete is made in step 322. If the integrated circuit or other device is complete, the method is complete and no further steps are performed. If the integrated circuit or other device is not complete, the step of performing the next processing step 324 is performed and the method is continued at the step of topology detection 312.

What has been described above are preferred embodiments of the present invention. It is of course not possible to describe every conceivable combination or permutation of components or methodologies for purposes of describing the present invention, but one of ordinary skill in the art will recognize that many further combination and permutations of the present invention are possible. Accordingly the present invention is intended to brace all such alternatives, modifications, and variations that fall within the spheres and scope of the appended claims. Also several embodiments in features are described above and are illustrated in the respect drawing figures; it will be appreciated that the features described and illustrated with respect to a given embodiment or feature may be used or incorporated in one or more of the other embodiments.

What is claimed is:

1. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein adjusting the apparent location of the metrology mark adjusts for optical horizontal shift.

2. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein determining the apparent location of the metrology mark is determined by determining a topological variation in a topology of the another layer relative to the topology of the at least one layer, wherein adjusting the apparent location of the metrology mark adjusts for topological horizontal shift.

3. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein adjusting the apparent location of the metrology mark includes an adjustment for at least one predetermined factor.

4. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein adjusting the apparent location of the metrology mark includes an adjustment for at least one non-predetermined factor.

5. An apparatus for aligning comprising:

a detector for detecting a topology of at least one layer to determine an apparent location of a metrology mark, the apparent location of the metrology mark being offset from the actual position of the metrology mark by a distortion amount; and a mask which is aligned according to the apparent location and adjustment information, wherein the adjustment information is corresponds to the distortion amount.

6. The apparatus of claim 5, wherein the detector is an atomic force microscope.

7. The apparatus of claim 5, wherein the detector is an optical detector.

8. The apparatus of claim 5, further comprising a planarizer that performs chemical-mechanical polishing.

9. The apparatus of claim 5, wherein the adjustment information is derived from at least one predetermined factor.

10. The apparatus of claim 5, wherein adjustment information is derived from at least one non-predetermined factor.

11. The apparatus of claim 5, further comprising a controller which selects the next processing step in accordance with information provided by the detector.

12. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein the another layer is formed on the at least one layer, wherein determining the apparent location of the metrology mark is determined optically, and wherein adjusting the apparent location of the metrology mark adjusts for optical horizontal shift.

13. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein the another layer is formed on the at least one layer, wherein determining the apparent location of the metrology mark is determined by determining a topological variation in a topology of the another layer relative to the topology of the at least one layer, and wherein adjusting the apparent location of the metrology mark adjusts for topological horizontal shift.

14. The method of claim 13, wherein atomic force microscopy is used in the detecting of the topology of the at least one layer.

15. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein the another layer is formed on the at least one layer, wherein adjusting the apparent location of the metrology mark includes an adjustment for at least one predetermined factor.

16. The method of claim 15, wherein determining the apparent location of the metrology mark is determined by determining a topological variation in a topology of the another layer relative to the topology of the at least one layer.

17. The method of claim 16, wherein planarization is performed on a surface of the at least one layer prior to determining the apparent location of the metrology mark.

18. An alignment method comprising:

detecting a topology of at least one layer;

determining an apparent location of a metrology mark;

adjusting the apparent location of the metrology mark to determine an adjusted location of the metrology mark; and aligning another layer according to the adjusted location of the metrology mark, wherein the another layer is formed on the at least one layer, wherein adjusting the apparent location of the metrology mark includes an adjustment for at least one non-predetermined factor.

19. An alignment method comprising:

detecting a topology of at least one layer;

determining an apparent location of a metrology mark;

adjusting the apparent location of the metrology mark to determine an adjusted location of the metrology mark; and aligning another layer according to the adjusting location of the metrology mark, wherein the another layer is formed on the at least one layer, wherein the apparent location of the metrology mark is offset from the adjusted location of the metrology mark by a distortion amount.

20. The method of claim 19, wherein the detecting the topology of the at least one layer is performed without coming into physical contact with a surface of the at least one layer.

* * * * *

UNITED STATES PATENT AND TRADEMARK OFFICE
CERTIFICATE OF CORRECTION

PATENT NO. : 6,813,574 B1
DATED : November 2, 2004
INVENTOR(S) : Yedur et al.

It is certified that error appears in the above-identified patent and that said Letters Patent is hereby corrected as shown below:

Column 3,
Line 62, replace "dip 206' when" with -- dip 206 when --

Column 4,
Line 7, replace "so C) little" with -- so little --

Signed and Sealed this

Fifteenth Day of February, 2005

JON W. DUDAS
*Director of the United States Patent and Trademark Office*